United States Patent
Rivera et al.

(10) Patent No.: US 12,356,857 B1
(45) Date of Patent: Jul. 8, 2025

(54) HIGH TEMPERATURE HEAT FLUX SENSORS

(71) Applicant: University of Rhode Island Board of Trustees, Kingston, RI (US)

(72) Inventors: Kevin M. Rivera, Providence, RI (US); Otto J. Gregory, Narragansett, RI (US)

(73) Assignee: University of Rhode Island Board of Trustees, Kingston, RI (US)

( * ) Notice: Subject to any disclaimer, the term of this patent is extended or adjusted under 35 U.S.C. 154(b) by 0 days.

(21) Appl. No.: 18/782,991

(22) Filed: Jul. 24, 2024

Related U.S. Application Data (60) Provisional application No. 63/528,544, filed on Jul. 24, 2023.

(51) Int. Cl.
*H10N 10/82* (2023.01)
*G01K 13/04* (2006.01)
*H10N 10/10* (2023.01)
*H10N 10/855* (2023.01)

(52) U.S. Cl.
CPC ............ *H10N 10/82* (2023.02); *G01K 13/04* (2013.01); *H10N 10/10* (2023.02); *H10N 10/855* (2023.02)

(58) Field of Classification Search
CPC ....... H10N 10/82; H10N 10/10; H10N 10/855
USPC ........................................................ 136/230
See application file for complete search history.

(56) References Cited

U.S. PATENT DOCUMENTS

| | | | |
|---|---|---|---|
| 7,849,752 B2 | 12/2010 | Gregory et al. | |
| 8,348,504 B2 | 1/2013 | Gregory et al. | |
| 8,568,026 B2 | 10/2013 | Gregory et al. | |
| 10,690,551 B2 * | 6/2020 | Gregory | G01K 7/08 |
| 2004/0202886 A1 * | 10/2004 | Subramanian | G01N 3/56 |
| | | | 427/596 |
| 2009/0290614 A1 | 11/2009 | Gregory et al. | |
| 2010/0158069 A1 * | 6/2010 | Yoo | H05K 1/0201 |
| | | | 374/E17.001 |
| 2011/0277803 A1 * | 11/2011 | Grande | G01K 7/028 |
| | | | 136/200 |
| 2018/0087973 A1 * | 3/2018 | Shi | C04B 41/009 |

OTHER PUBLICATIONS

Ewing, Jerrod, et al., "A direct-measurement thin-film heat flux sensor array", Measurement Science and Technology, vol. 21, No., 10, 2010, 1-8.

Farahmand, Kambiz, et al., "Experimental Measurement of Fine Thermocouple Response Time in Air", Experimental Heat Transfer, vol. 14, No. 2, 2001, 107-118.

(Continued)

*Primary Examiner* — Mirellys Jagan (74) *Attorney, Agent, or Firm* — Philip D. Askenazy; Peacock Law P.C.

(57) ABSTRACT

Temperature sensors particularly suitable for high temperature heat flux measurements across the thickness of a component, for example a turbine blade. The sensors comprise one or more conductive traces that wrap around an edge of the component, thereby connecting one or more hot junctions on the hot side of the component to the cold junction contacts on the colder side of the component. In some embodiments the traces comprise two dissimilar materials, such as indium tin oxide (ITO) and platinum. Alternatively, if the component is electrically conductive, the component itself can form one thermoelement of the sensor.

16 Claims, 6 Drawing Sheets

(56) References Cited

OTHER PUBLICATIONS

Fralick, G. C., et al., "Thin film heat flux sensor of improved design", 48th International Instrumentation Symposium, Sep. 2002, 1-5.

Gifford, A. R., et al., "Durable heat flux sensor for extreme temperature and heat flux environments", Journal of Thermophysics and Heat Transfer, vol. 24, No. 1, 2010, 69-76.

Hager, J. M., et al., "Experimental performance of a heat flux microsensor", Trans. ASME, vol. 113, 1991, 246-250.

Katoh, Yutai, et al., "Mechanical Properties of Chemically Vapor-Infiltrated Silicon Carbide Structural Composites with Thin Carbon Interphases for Fusion and Advanced Fission Applications", Materials Transactions, vol. 46, No. 3, 2005, 527-535.

Lyu, Wen, et al., "A Novel Ceramic-Based Heat Flux Sensor Applied for Harsh Heat Flux Measurement", IEEE Sensors, 2018, 1-4.

Naslain, R. R., "SiC-matrix composites: nonbrittle ceramics for thermo-structural applications", Int. J. Appl. Ceram. Technol., vol. 2, Issue 2, Mar. 14, 2005, 75-84.

Pullins, C. A., et al., "In situ high temperature heat flux sensor calibration", International Journal of Heat and Mass Transfer, vol. 53, No. 17-18, 2010, 3429-3438.

Rivera, Kevin, et al., "Diffusion barrier coatings for CMC thermocouples", Surface and Coatings Technology, vol. 336, 2018, 17-21.

Rivera, Kevin, et al., "ITO:SiC Ceramic Matrix Composite Thermocouples for Engine Components", IEEE Sensors Letters, vol. 4, No. 5, 2020, 1-4.

Rivera, Kevin, et al., "Novel heat flux sensor for SiC—SiC ceramic matrix composite engine components", Sensors & Actuators: A. Physical, 345 (2022) 113771, Jul. 22, 2022.

Rivera, Kevin, et al., "Novel Temperature Sensors for SiC—SiC CMC Engine Components", Journal of Materials Research, vol. 32, No. 17, 2017, 3319-3325.

Tong, H. M., et al., "High-temperature thin-film Pt—Ir thermocouple with fast time response", Review of Scientific Instruments, vol. 58, No. 5, 1987, 875-877.

Trelewicz, Jason R., et al., "High-Temperature Calibration of Direct Write Heat Flux Sensors From 25 °C to 860 °C Using the In-Cavity Radiation Method", IEEE Sensors Journal, vol. 15, No. 1, 2015, 358-364.

Wilson, Scott, et al., "Fabrication and testing of a thin-film heat flux sensor for a stirling convertor", 7th International Energy Conversion Engineering Conference, Aug. 2009, 4581.

Wrbanek, J. D., et al., "Thin film heat flux sensor development for ceramic matrix composite (CMC) systems", 45th Joint Propulsion Conference & Exhibit, Aug. 2009, 5066.

Zhang, Tong, et al., "Design and Fabrication of a Thick Film Heat Flux Sensor for Ultra-High Temperature Environment", IEEE Access, vol. 7, 2019, 180771-190778.

Zhang, C., et al., "Design, Fabrication and Characterization of High Temperature Thin Film Heat Flux Sensors", Microelectronic Engineering, vol. 217, 2019, 111128.

Zhang, Chi, et al., "The electrochemical deconsolidation mechanism of graphite matrix in HTGR spherical fuel elements", Journal of Nuclear Materials, vol. 525, 2019, 1-6.

Zribi, Aymen, et al., "Design, fabrication and characterization of thin film resistances for heat flux sensing application", Sensors and Actuators A: Physical, vol. 245, 2016, 26-39.

\* cited by examiner

HIGH TEMPERATURE HEAT FLUX SENSORS

CROSS-REFERENCE TO RELATED APPLICATIONS

This application claims priority to and the benefit of the filing of U.S. Provisional Patent Application No. 63/528,544, entitled "HIGH TEMPERATURE HEAT FLUX SENSORS", filed on Jul. 24, 2023, the entirety of which is incorporated herein by reference.

BACKGROUND OF THE INVENTION

Note that the following discussion may refer to a number of publications and references. Discussion of such publications herein is given for more complete background of the scientific principles and is not to be construed as an admission that such publications or references, or those submitted in any invention disclosure statement submitted for this patent application, are prior art for patentability determination purposes or are relevant to the present invention, per 37 C.F.R. § 1.97(h).

Accurate and reliable heat flux measurement during a gas turbine engine's validation phase is crucial for developing robust structural models. Silicon carbide-silicon carbide ceramic matrix composites, or SiC—SiC CMC's, have been considered for some time now as a replacement for nickel-based superalloys used in gas turbine engine hot sections due to their refractory nature and excellent toughness at high temperatures. SiC—SiC CMC's are considerably tougher than monolithic ceramics and more refractory than nickel-based super alloys. Within the past decade, SiC—SiC CMC's have been successfully implemented by GE, helping their Leap Engines achieve 15% greater fuel efficiency compared to similar engines. As gas turbine engine companies continue to expand the use of SiC—SiC CMC's as a preferred material for engine hot section, it is becoming increasingly more important that compatible sensors be developed to enable reliable temperature, rotational force and heat flux measurement. The use of CMC's presents compatibility issues with traditional instrumentation normally used in validation phase measurements. Commonly used sensors such as wire-based thermocouples, strain gages and heat flux sensors are typically welded onto engine components. These sensors are highly dependable but due to surface welding not being a possibility on ceramic engine components, suitable instrumentation must be developed for these ceramic engine components.

Heat flux sensors which conform to ASTM E2683-17 comprised of thin film planar thermopile arrays have been considered for such applications, but because both junctions are on the same side of the substrate these typically utilize a dielectric coating at their cold junction to impose a temperature gradient between the hot and cold junctions that serves as the driving force for thermoelectric output. Some thin film thermopile arrays designed for high temperatures require a substantial number of thermocouples in series due to their low output, increasing fabrication complexity. Thin film thermopile arrays designed for lower temperatures contain thermopile arrays with fewer thermocouple junctions, but this is only achieved using refractory polymer coatings with low thermal conductivities to ensure large temperature gradients. Some thin film thermopile array heat flux sensors utilize conductive ceramics in anticipation of operating temperatures beyond 1200° C. but have low and unstable output voltages which make calibration difficult. Many of these thermopile heat flux sensors are extremely robust but have an output that is not directly proportional to the heat flux passing through the substrate onto which they are deposited. They therefore require accurate mathematical models and a high degree of knowledge of the dielectric layer to estimate the temperature gradients generated between the hot and cold junctions in order to approximate the heat flux. Differential resistance-based Pt thin film heat flux sensors have been developed but are difficult to fabricate and have only been evaluated at temperatures up to 100° C.

Measurements using differential resistance temperature detectors (RTDs) have been used in the past but have only been validated at relatively low temperatures (20° C. to about 100° C.). Differential thermopile arrays have also been used for this purpose with some being relegated to low temperatures (<300° C.), while others have been designed for high temperature applications (>1000° C.), but have surface profiles (i.e. thicknesses) that surpass the gas flow boundary thickness in gas turbine engine environments, rendering them unsuitable for such applications.

SUMMARY OF THE INVENTION

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate the practice of embodiments of the present invention and, together with the description, serve to explain the principles of the invention. The drawings are only for the purpose of illustrating certain embodiments of the invention and are not to be construed as limiting the invention. In the drawings.

DETAILED DESCRIPTION OF EMBODIMENTS OF THE INVENTION

Embodiments of the present invention are heat flux sensors that are suitable for high temperature applications. The sensors are preferably configured to measure the heat flux (i.e. the temperature gradient) across the thickness of a component, for example a turbine blade. As used throughout the specification and claims, the term "component" means an object whose temperature is to be measured, including but not limited to a component, substrate, part, engine component, turbine blade, and the like. The component can be electrically conductive, for example comprising silicon carbide-silicon carbide (SiC—SiC) CMCs, or nonconductive, for example comprising high temperature oxides. Some embodiments of the present invention utilize a thermocouple which uses a junction preferably formed from a conductive thermoelement (e.g. comprising platinum) and a conductive substrate itself, described in more detail in U.S. Pat. No. 10,690,551, incorporated herein by reference. Other embodiments comprise a thermocouple comprising, for example, platinum:indium tin oxide (Pt:ITO) junctions, or a plurality of such thermocouples forming a thermopile. The number of thermocouple junctions in the thermopile is easily customizable for different applications. Electrically conductive components are typically coated with a dielectric or insulating layer before the thermocouple leg or legs are deposited; electrically non-conductive components may not require such a layer.

In all embodiments a conductive material connecting the hot junction and at least one of junctions on the cold side of the component preferably wraps around an edge of the component from one surface to the opposite surface, so that for each thermocouple the hot junction is located on the hotter side of the component and the cold junction is located on the colder side of the component. The devices' thermoelectric voltage output is preferably directly proportional to the heat flux passing through the thickness of the substrate because a temperature gradient is imposed along the through thickness direction of the substrate and acts as the driving force for heat transfer and the resulting thermoelectric potential. Any of the materials disclosed herein may be substituted with similar materials known in the art.

The Pt:ITO embodiments can also be used to harvest thermal energy. As a temperature gradient forms between the hot and cold junction of the thin film heat flux sensor, a thermoelectric voltage will be generated based on the Seebeck coefficient of the thermoelement materials. In normal operation, the output of the thin film heat flux sensor is measured using a high input impedance device, such as a voltmeter, which measures the open circuit output of the thin film heat flux sensor. When an electrical load is connected to the leads of the thin film heat flux sensor, electrical current flows through the circuit and power can be generated by the sensor.

When used in thermal energy generation mode, several parameters are preferably optimized to generate the desired energy. Parameters such as thin film width, thickness, chemical composition as well as then number of thermopile junctions will adjust the maximum current and voltage that the sensor will be able to generate. Because of the small cross-sectional areas achievable with thin films, large widths are required. The energy generated is calculated using the equation $P=IV$, where I is the total current flowing though the circuit and V is the total voltage generated. Because of the size limitations imposed by the engine components within the hot section of gas turbine engines, this energy harvesting application can be more suitable for low powered electronics. When used in thermal energy generation mode, the sensor can still be used to measure heat flux if the voltage across the sensor is measured.

EXAMPLES

Example 1: Bulk Junction (Pt:SiC—SiC CMC) Heat Flux Sensor

Figure 1:
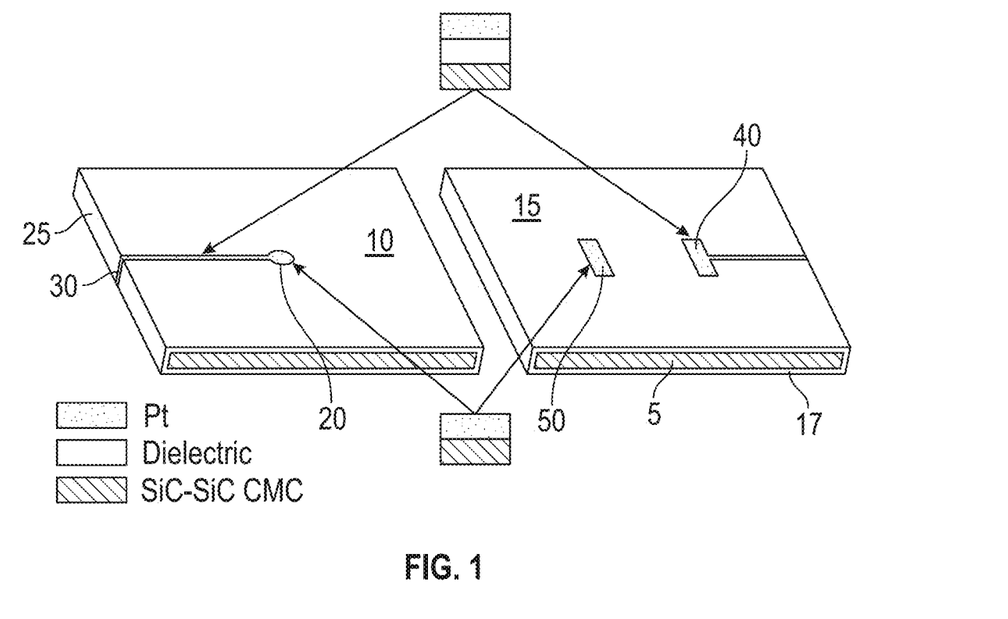
FIG. 1 shows schematics of the hot junction on one side of a SiC—SiC CMC substrate (left schematic) and the cold junction on the opposite side of the same SiC—SiC CMC substrate (right schematic) of a Pt:SiC—SiC CMC heat flux sensor of the present invention.

Rectangular SiC—SiC CMC substrates measuring 33.35 mm×25.4 mm×3 mm were heat treated in a Deltech muffle furnace at 1200° C. for 5 h to remove surface impurities and grow a passive surface oxide. A mullite coating was then applied to surface and heat treated on a Fischer Scientific hotplate at 100° C., 200° C. and 300° C. for 20 minutes each to evaporate solvent, and then heat treated at 1000° C. for 2 h in a tube furnace. In other embodiments a dielectric or insulating material other than mullite may be used. This process was repeated on the opposite face and sides of the SiC—SiC CMC plates. The final thickness of the mullite coating on each face was approximately 40 µm and vias were created in the mullite coating in the areas where the SiC—SiC CMC would make contact to the conductive (in this example, platinum) thin films both in the hot and cold junction regions, as shown in FIG. 1. The vias etched using a buffered HF solution consisting of 4 g of $NH_4F$, 6 mL of DI water and 1 mL of HF to remove the passive surface oxide. The etched samples were then dump rinsed in a small ultrasonic cleaner and then dried using high pressure air. The mullite coated SiC—SiC CMC substrates were covered with photoresist (Dupont MX5040) and soft baked for 1 minute at 100° C. to adhere the photoresist onto the surface. A sensor pattern was transferred using a mylar photomask and a UV exposure tool.

The samples were loaded into an MRC 8667 sputtering machine which was pumped down to a base pressure of 5E-7 torr. Argon gas was bled into the sputtering chamber to achieve a nominal pressure of 9E-3 torr and then Pt was sputtered at 200 W for 2 h to form a 2 µm thick film. The sputtering process was repeated several times to form the platinum film thermocouple leg that wrapped around the substrate. The patterned SiC—SiC CMC substrates were removed from the sputtering chamber and the excess photoresist was removed using acetone. A nitrogen anneal at 500° C. for 5 h was used to remove point defects and residual stresses in the sputtered films. Platinum wires (0.001") were then bonded to platinum bond pads by applying a thick platinum paste between them and sintering the paste on a hot plate. An ohmic contact was made between the paste, wires, and bond pads.

Once completed, hot junction 20 on hot side 10 of component 5 comprised the platinum/SiC—SiC CMC junction, in which CMC component 5 serves as one of the thermoelements of a thermocouple. Because component 5 is electrically conductive, it was first coated by a dielectric or insulating layer 17, in this example mullite. The other leg comprised platinum film 30 which wraps around edge 25 of component 5 to provide electrical connection to first cold junction 40 on cold side 15 of component 5. Second cold junction 50 was formed by platinum in direct contact with component 5 on cold side 15.

Figure 2:
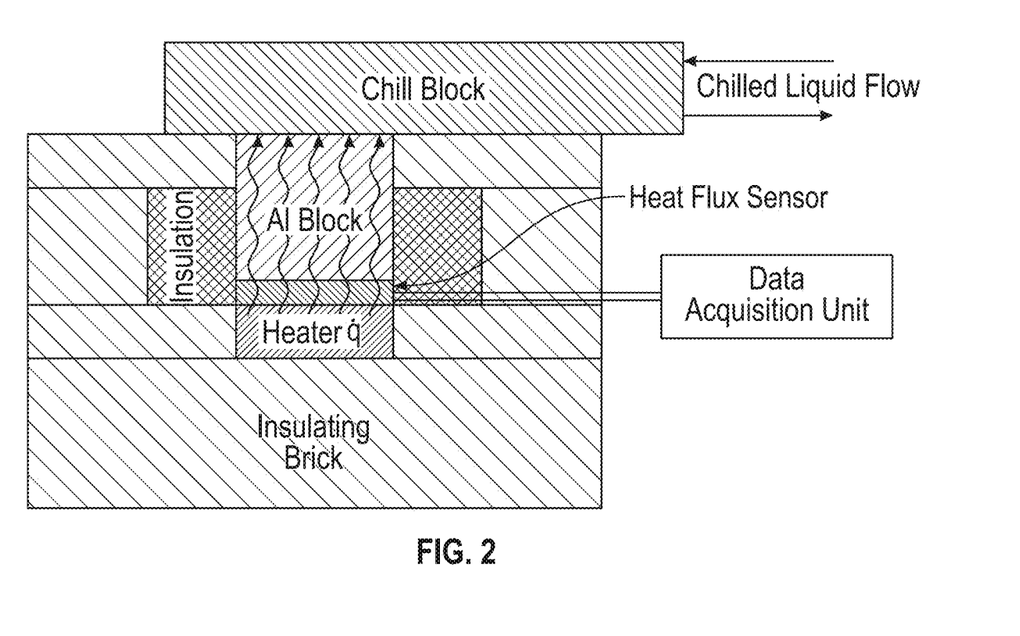
FIG. 2 is a cross-sectional schematic of a calibration and testing setup for the present invention, the red arrows showing the direction of heat flow being from the heater plate (heat flux source) to an aluminum block thermally connected to a chill block through which chilled water was circulated. This results in one dimensional heat flow through the heat flux sensor from its bottom face to its top face.

The heat flux sensors were tested using the custom-built insulated plate heater apparatus shown in FIG. 2. The plate heater was connected to a variable transformer and the voltage was adjusted accordingly. The heat dissipated by the plate heater was assumed to be equal to the electrical power being consumed by the plate heater, calculated by taking the product of the voltage and current across the heater. The heating circuit consisted of a resistive heater plate in series with an AC variable autotransformer. A digital oscilloscope was used to confirm that the voltage and current were in phase. The AC voltage and current were measured using a digital multimeter and hall sensor, respectively. At each voltage, the plate heater was ramped up in temperature and held at temperature for several hours to ensure that an equilibrium state was achieved. The voltage output of the heat flux sensors was measured using a PDaq54 that provided 23 bit analog to digital conversion which was necessary for high accuracy of the small voltages produced. The temperature range of the heat flux sensor was maintained between 20° C. and 550° C., since temperatures higher than 550° C. promoted oxidation of the SiC—SiC CMC at the Pt:SiC—SiC CMC junction and lead to sensor failure due to the contact between the Pt and SiC—SiC CMC going from ohmic to Schottky due to the formation of $SiO_2$.

Uncertainty in the sensor's measurement sensitivity came from several sources, including reference sensor uncertainty, measurement system uncertainty, and test setup uncertainty. The type K thermocouples used (OMEGA) had an uncertainty of ±0.75% or a maximum temperature uncertainty of ±2.2° C. The multimeter used had reported uncertainties of ±3.0% and ±1.2% for AC current (±0.0198 A) and AC voltage (±1.44V) readings respectively. The PDaq54 used had a voltage measurement uncertainty of ±0.015% of the reading (±0.22 µV) and a ±0.004% uncertainty associated with the voltage range selected (±1.24 µV). The temperature gradient produced by the custom-built insulated plate heater apparatus existed in the +z direction (through thickness of the substrate and conducted through the aluminum stack), but temperatures were also measured in the −z direction (1 cm under the plate heater in the insulating brick), in the x direction (same plane as sensor but 1 cm from the edge in the x-axis within the insulation), and y direction (same plane as sensor but 1 cm from the edge in the y-axis within the insulation) to monitor changes. Uncertainties in the x, y and −z temperatures were determined to be ±2.994%, 0.713% and ±0.288% respectively. The total uncertainty was determined to be the combination of the reference sensor uncertainty, measurement system uncertainty and the test setup uncertainty, and equaled ±9%.

Figure 3:
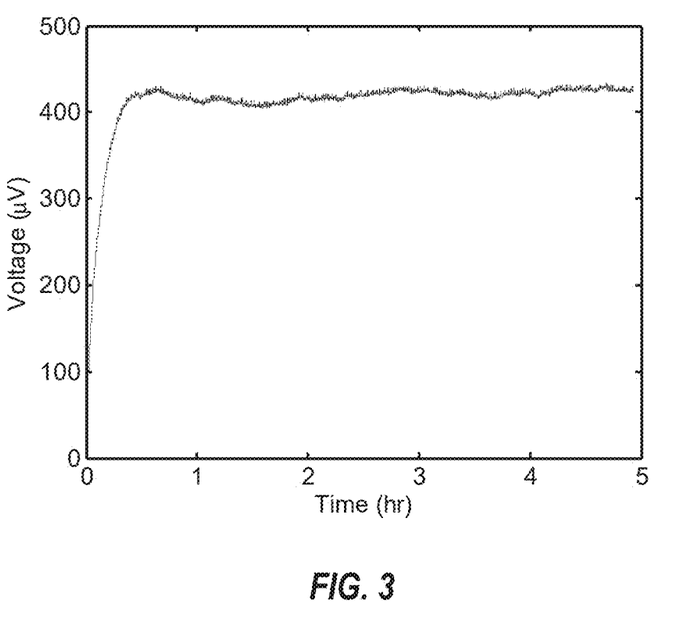
FIG. 3 shows the typical output of a Pt:SiC—SiC CMC sensor of the present invention while being tested using the custom-built apparatus of FIG. 2. The heat flux sensor was exposed to a flux of 17.25 kW/m$^2$.
Figure 4:
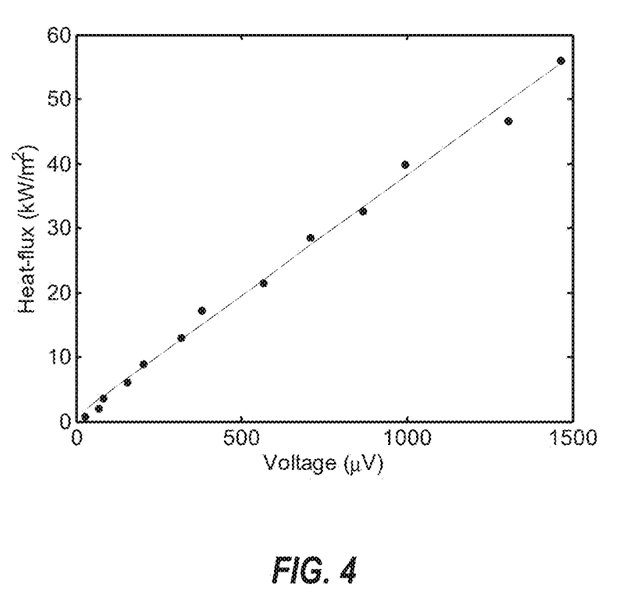
FIG. 4 shows the heat flux sensor output voltage as a function of heat flux for the Pt:SiC CMC heat flux sensor. The slope according to a linear fit was 0.0266 µV/(W/m$^2$).

Heat fluxes between 0.73 kW/m$^2$ and 56.02 kW/m$^2$ were applied to the heat flux sensor, which in turn produced a successively larger thermoelectric output voltage ranging from 24.55 µV to 1463.50 µV. Because the testbed was well insulated, heat transfer was assumed to be entirely due to conduction in these experiments. Since the output of the Pt:SiC—SiC CMC heat flux sensor was directly proportional to the heat flux passing through the SiC—SiC CMC substrate, a calibration curve was generated using the steady-state voltages acquired. The custom-built insulated plate heater setup took relatively long to reach a steady state, but the sensor response was highly stable once that state was reached, as shown in FIG. 3. Because the Pt:SiC—SiC CMC heat flux sensor output had a high degree of linearity, a first-order fit was applied to the data as shown in FIG. 4 and a calibration factor of 0.0266 µV/(W/m$^2$) was determined. This value was very similar to results achieved using other approaches taken from the literature, as shown in Table 1. Under these testing conditions, Seebeck coefficients between 4.22 µV/K and 11.56 µV/K were generated. These values are much smaller than previously reported, but this is due to the much smaller temperature differences which exist between the hot and cold junctions.

TABLE 1

Heat flux sensors and their sensitivities

| Type | # of thermocouple junctions in series | Calibration factor [µV/(W/m$^2$)] |
|---|---|---|
| Pt:Pt/Rh | 160 | 0.14 |
| Pt:Pt/Rh | 130 | 0.03 |
| Pt:Pt/Rh | 18 | 0.1038 |
| Al:ZnO/N:ITO | 40 | 0.000006 |
| Pt:SiC-SiC CMC | 1 | 0.0266 |
| Pt:ITO (Example 2) | 3 | 0.0222 |

Figure 5:
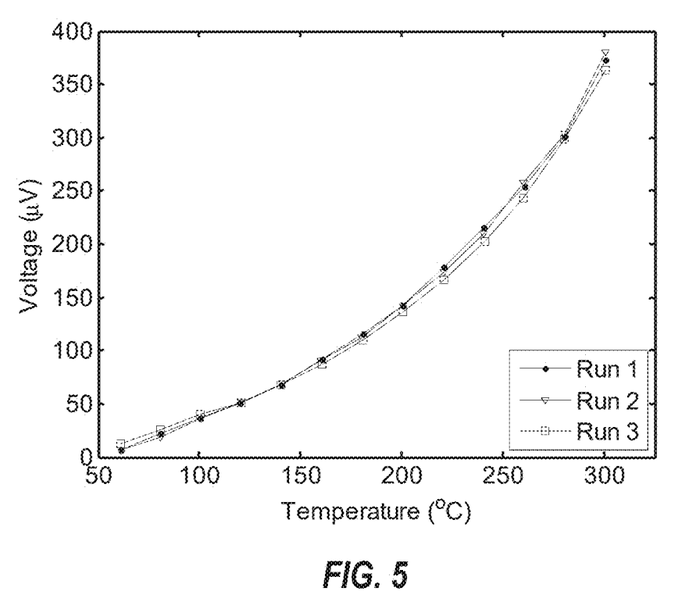
FIG. 5 shows the repeatability of the thermoelectric responses for the Pt:SiC CMC heat flux sensor.
Figure 6:
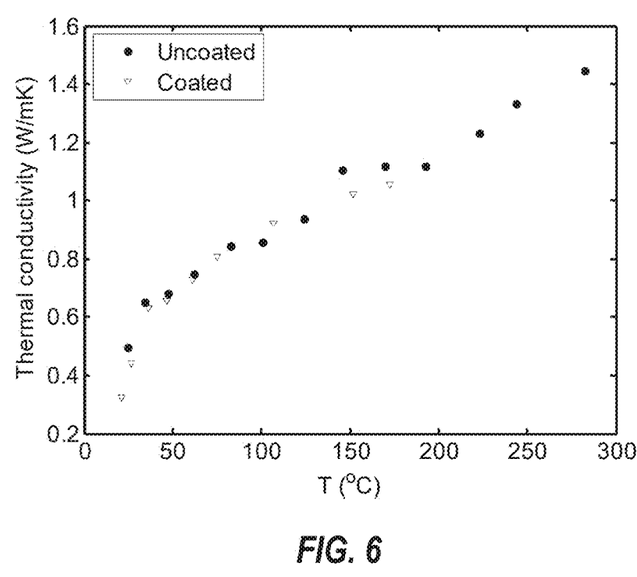
FIG. 6 shows the thermal conductivity as a function of average temperature of a SiC—SiC CMC substrate with and without a 40 µm mullite coating.

The repeatability of the heat flux sensor output was determined by thermal cycling on a laboratory hot plate. For these tests, the chilled block was not used in order to simulate smaller temperature differences between the hot and cold junctions. The thermoelectric potentials were reduced and potentials ranged from 10-375 µV in the temperature range of 60-300° C., as shown in FIG. 5. This temperature range was selected due to the observation that the Pt:SiC—SiC CMC contact began to slowly and irreversibly oxidize above this temperature. After three thermal excursions, very little hysteresis was evident, with the largest shift in thermoelectric potential occurred at 245° C. and was approximately 15 µV in magnitude. After examining the heat flux sensor under an optical microscope before and after each test it was determined that the behavior was due to dewetting of the Pt thin films at the Pt:SiC—SiC CMC junction and the increased oxidation of the SiC—SiC CMC. At temperatures above 550° C., this oxidation eventually led to the formation of a rectifying contact as has been shown in previous studies. The thermoelectric potential was characterized using Equation (1):

$$V_T = \frac{\Delta V}{\Delta T} \tag{1}$$

where ΔT is the temperature difference between the top and bottom face of the SiC—SiC CMC substrate and ΔV is the voltage potential being produced by the Pt:SiC—SiC CMC heat flux sensor.

The most important dimension of the SiC—SiC CMC substrate that affects sensor performance is thickness, because this is the direction in which the temperature gradient for the heat flux sensor exists. In order to model Pt:SiC—SiC CMC heat flux sensors with different thicknesses, it is important to determine the thermal conductivity of the SiC—SiC CMC substrate. Additionally, since there was a mullite coating applied to the top, bottom and sides of the SiC—SiC CMC substrates, the thermal conductivity with and without the mullite coating was evaluated. The same apparatus as before was utilized and 0.127 mm diameter type-K thermocouples were used to measure the temperatures of the hot and cold junctions. To reduce the thickness of the thickness of the thermocouple bead it was placed between two pieces of alumina and a force was applied using a hammer. There existed a thermal resistance between the thermocouples and the substrate surface but the substrates were flat and pressure was applied over the chill block to ensure sufficient mechanical contact between the thermocouples and the substrates. Because of this it is believed that the effect of this thermal resistance was negligible. When the plate heater was ramped from 50° C. to 600° C., the resulting average temperature between the hot and cold side of the mullite coated SiC—SiC CMC substrate ranged from 20.83° C. to 172.44° C. The mullite coated SiC—SiC CMC showed a thermal conductivity range of 0.323 $Wm^{-1}K^{-1}$ to 1.054 $Wm^{-1}K^{-1}$. Likewise, the SiC—SiC without the mullite coating was exposed to the same temperature range and had a temperature difference ranging from 24.28° C. to 282.46° C. The resulting thermal conductivity ranged from 0.496 $Wm^{-1}K^{-1}$ to 1.444 $Wm^{-1}K^{-1}$, as shown in FIG. 5. This result was expected since the mullite is less thermally conductive than the SiC and thus reduced the overall thermal conductivity. The testing environment was well-controlled and a one dimensional Fourier heat transfer was assumed for these experiments, described by Equation (2):

$$Q = kA \frac{\Delta T}{\Delta z} \quad (2)$$

where Δz is the thickness of the substrate, k is the thermal conductivity of the SiC—SiC CMC, A is the area of the SiC—SiC CMC substrate, Q is the power applied by the heater plate, and ΔT is the temperature difference between the top and bottom faces of the of the SiC—SiC CMC substrate. As a function of average temperature, the thermal conductivity did not vary much between the coated and uncoated tests, but there was a slight nonlinearity noted in the coated case. This nonlinearity was attributed to the slight roughness in the mullite coating which added some additional thermal resistance between the coated SiC—SiC CMC and the heater plate due to the air which would occupy these locations.

This sensor did not utilize protective barrier coatings and thus was operable only at temperatures below 550° C. but with proper oxygen and silicide diffusion barriers, as disclosed in U.S. Pat. No. 10,690,551, such bulk heat flux sensors can operate at 1000° C.

Example 2: Thin Film (Pt:ITO) Heat Flux Sensor

Figure 7:
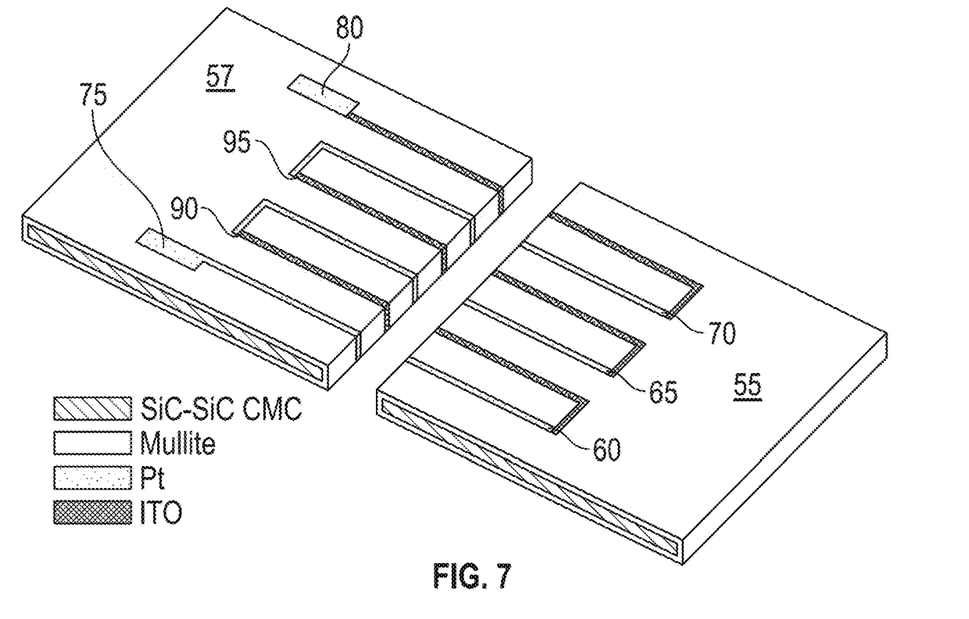
FIG. 7 shows schematics of the hot junctions on one side of a SiC—SiC CMC substrate (right schematic) and the cold junctions on the opposite side of the same SiC—SiC CMC substrate (left schematic) of a Pt:ITO thermopile heat flux sensor of the present invention.

A thin film heat flux sensor comprising three Pt:ITO junctions in series was manufactured. The PT:ITO sensor was deposited on a mullite coated silicon carbide-silicon carbide CMC (SiC—SiC CMC). As shown in FIG. 7, a unique sensor geometry was devised such that hot junctions 60, 65, and 70, formed at the metallurgical contacts between ITO and Pt traces, were formed on hot side 55 of the component, while cold junctions 75, 80 and intermediate cold junctions 90, 95 were formed on cold side 57 of the component. Interconnections between these junctions were wrapped around the edge of the component. Although cold junction 80 is shown as comprising Pt, it could optionally comprise ITO without significant change to the measurement. The result of using this geometry was a heat flux sensor capable of utilizing a temperature gradient along the thickness direction of the SiC—SiC CMC component to produce a thermoelectric output voltage that was proportional to the heat flux passing through the substrate.

Initially, a SiC—SiC CMC substrate (33.35 mm×25.4 mm×3 mm) was placed in separate baths of acetone, methanol, and distilled water for 5 minutes each to wash away organic surface impurities. The substrates were then heat treated in a high temperature tube furnace at 1200° C. for 5 h in air to promote the growth of a thermal oxide. The substrate was then coated with a 40 μm layer of mullite and heat treated on a hot plate at 100° C., 200° C. and 300° C. for 10 minute each followed by a furnace bake at 1000° C. for 2 h in air to fully sinter the coating. The same procedure was followed to coat the remaining exposed areas of the SiC—SiC CMC substrate. The substrate was then coated with a layer of photoresist and the first of six patterning steps was conducted as follows: A pattern was placed over the photoresist and exposed to a UV lamp for 2 seconds. The pattern was then developed by placing the substrate in a developer solution. The substrate was then placed in a sputtering machine (MRC 8667) and a cryopump was used to achieve a nominal background pressure of 3.5E-7 Torr. Argon was introduced in the sputtering chamber until the pressure reached 9E-3 Torr. Pt was then deposited on the substrate using a radio frequency generator set to 300 W for 2 h and this resulted in a 2 μm thick film. After sputter deposition, the substrate was left under vacuum for 15 hours to allow for thin film densification. The substrate was removed from the chamber and placed in an acetone bath to remove the photoresist and subsequently repatterned to deposit the complimentary ITO films. ITO thin films (90:10) were deposited at 300 W for 5 h in a 9E-3 Torr Argon atmosphere to achieve 5 μm thick films. In total there were six deposition steps required to fabricate a three junction thermopile that wrapped around the substrate, as shown in FIG. 7. When the deposition steps were completed, the PT:ITO was then annealed in nitrogen at 600° C. for 5 h followed by an anneal at 1000° C. in air for 2 h to relieve stresses and to crystallize the films.

Figure 8:
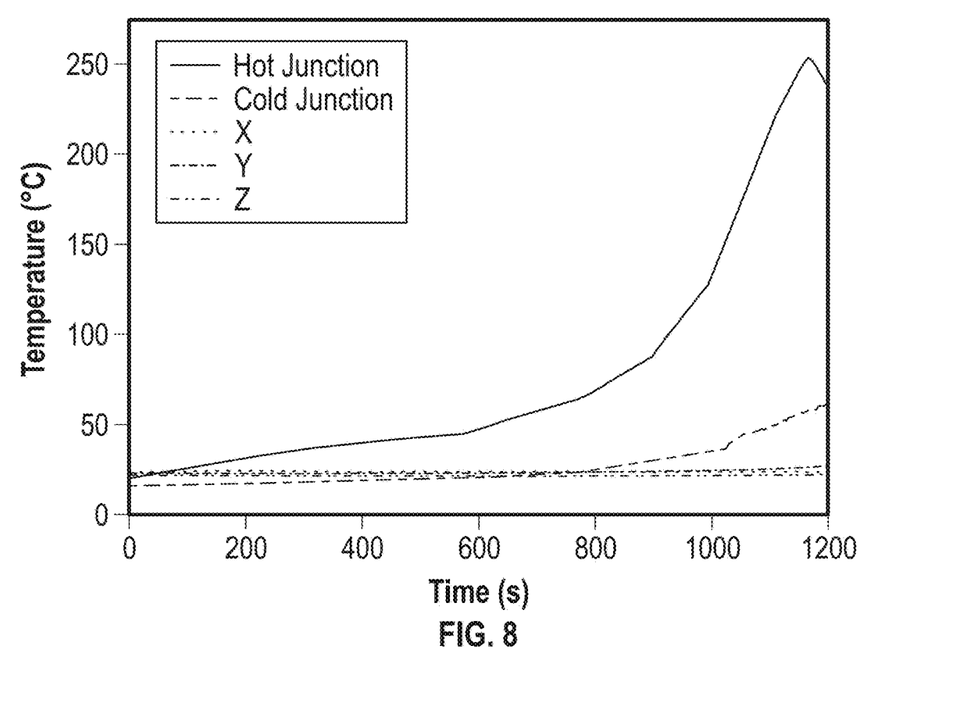
FIG. 8 shows a thermal ramp test used to determine the effectiveness of the insulating properties of the test rig of FIG. 2. The majority of the heat flows along the hot and cold junctions, which are all situated in the +z direction.

The PT:ITO sensors were tested using a custom-built insulated heating setup, shown in FIG. 2. Ceramic insulation was used to insulate the bottom of the heater as well as the sides of the sensor and heater. A piece of aluminum with the same area as the SiC—SiC CMC substrates was placed on the sensor and was attached to a separate aluminum block with chilled water running through it. Copper paste was used to provide a thermally conductive interface between the aluminum block on the sensor and the aluminum chill block. This enabled the majority of the heat dissipated by the plate heater to conduct through the sensor in order to validate calibration experiments. The plate heater, connected to a variable transformer, supplied heat to the PT:ITO sensor generating the temperature gradient along the thickness direction needed to drive the PT:ITO sensor output. To determine the dominant direction of heat flow, Type-k thermocouples were placed within the insulating brick 1 mm away from the heater plate in the X, Y, Z. Type K thermocouples were also placed on the PT:ITO hot and cold junctions located in the +Z direction (3 mm spacing between these junctions). As shown in FIG. 8, the largest temperature gradient was measured in the +Z direction as expected, and as more power was dissipated through the plate heater, all temperatures increased, but the changes in temperature measured in the X, Y and Z directions were below 3% of the overall temperature change seen in the +Z direction. Initially the chilled water caused the temperatures measured at the hot and cold junction to be lower than those measured in the X, Y and Z positions due to the relatively high thermal conductivity of the SiC—SiC CMC compared to the insulating brick. The output voltage of the PT:ITO sensor was measured using a PDAq54 data acquisition unit capable of 23 bit analog to digital conversion.

An uncertainty analysis (Type B) related to the experimental setup used for the PT:ITO sensor was conducted to give some insight into the measurement uncertainty. The custom-built test rig primarily dissipated heat along the +z direction but it was determined that uncertainties of ±2.994%, ±0.713% and ±0.288% existed in the x, y and −z directions respectively. The thin type K thermocouples (OMEGA) used for reference temperature measurements had a manufacturer uncertainty of ±0.75% and this resulted in a temperature uncertainty of ±2.2° C. The data acquisition unit used to measure the output voltage of the PT:ITO (PDAq54) with a 23-bit A/D converter had a measurement uncertainty of ±0.015% and an associated uncertainty with the selected voltage range of ±0.004% leading to voltage uncertainties of ±0.22 µV and ±1.24 µV respectively. The multimeter used to measure AC voltage and current provided a calibration certificate which specified uncertainties of ±3.0% (±0.0198 A) and ±1.2% (±1.44V) respectively within the specific ranges used. The test setup uncertainty, reference sensor uncertainty and the measurement system uncertainty resulted in a combined total uncertainty of ±8.96%.

Figure 9:
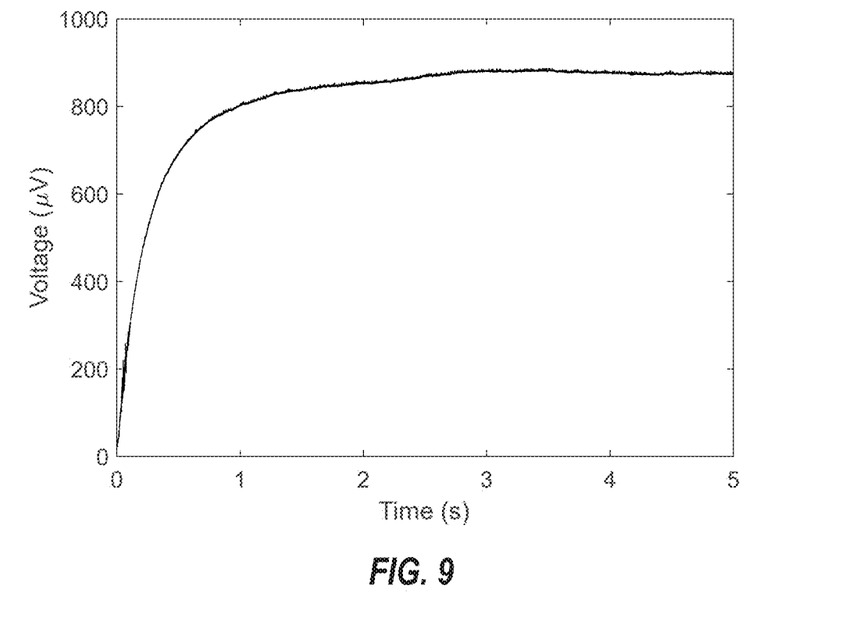
FIG. 9 shows a typical output of the Pt:ITO sensor using the custom-built test rig. The heater plate dissipated 40550 W/m$^2$ of power and the sensor equilibrated at an output voltage of 873.75 µV.
Figure 10:
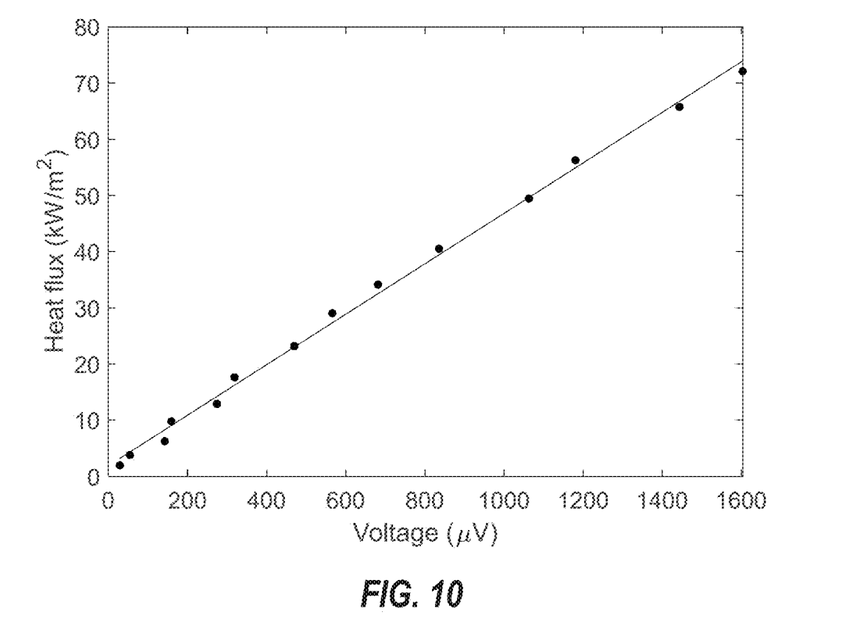
FIG. 10 shows a calibration curve for the Pt:ITO sensor. The calibration factor is 0.0222 µV/(W/m$^2$).

The PT:ITO sensor was evaluated at several heat flux values ranging from 1.97 kW/m$^2$-72.13 kW/m$^2$ and the output voltages measured were between 28.74 µV-1602.92 µV. The tests were conducted for long enough periods of time at each heat flux value to ensure a stable steady state output voltage, as shown in FIG. 9. A calibration curve could then be generated by recording the steady state voltage values at each heat flux value, as shown in FIG. 10. The calibration curve of the PT:ITO sensor could be approximated by a linear fit and this slope (calibration factor) was measured to be 0.0222 µV/(W/m$^2$), which is comparable to other thin film thermopiles reported in literature (see Table 1, above). The Seebeck coefficient of the PT:ITO sensor varied between 2.73 µV/° C.-10.32 µV/° C. within the range of heat flux values used for calibration. Compared to the bulk heat flux sensor's calibration factor of 0.0266 µV/(W/m$^2$), the calibration factor of the PT:ITO sensor was only slightly smaller. It is also important to note that the PT:ITO sensor output can be tuned depending on the number of thermopile junctions present. More thermopile junctions would result in a larger response to an applied heat flux and therefore an improved calibration factor. Interestingly, increasing or decreasing the number of thermopile junctions does not increase or decrease the number of sputter steps required. Thus, the number of junctions in the thermopile could be increased to increase sensitivity without complicating the fabrication process.

Figure 11:
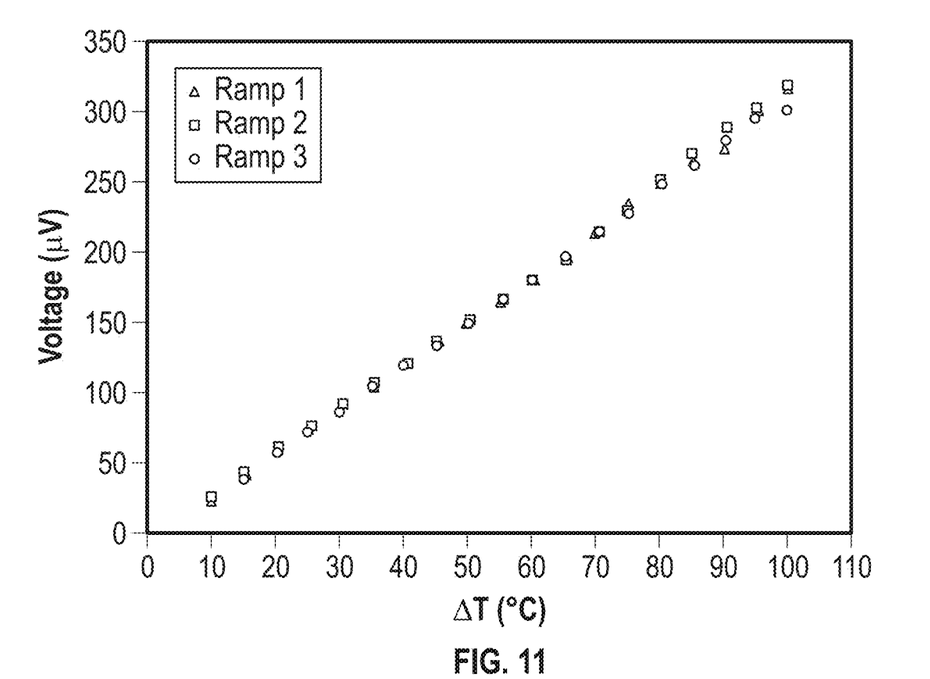
FIG. 11 shows repeatability testing of the Pt:ITO sensor. The Pt:ITO sensor was thermally ramped six times between 20° C.-500° C., which resulted in a ΔT that varied between 10° C. and 100° C.

The PT:ITO sensor was thermally ramped several times on a hot plate to evaluate the repeatability of the thermoelectric output. The cold junction of the PT:ITO was connected to the chill block used for the heat flux experiments to maintain a relatively lower temperature at the cold junction. With the chill block, temperature differences as large as 100° C. were achieved. After three successive thermal ramps, very little hysteresis could be seen between a temperature difference of 10-85° C., as shown in FIG. 11. Above a ΔT of 85° C., the hysteresis varied from 10.336 µV-16.925 µV. It was noted that the output of the PT:ITO sensor was linear as a function of temperature and heat flux which is beneficial for generating first order calibration equations that can make computation of these measurements very efficient.

Figure 12:
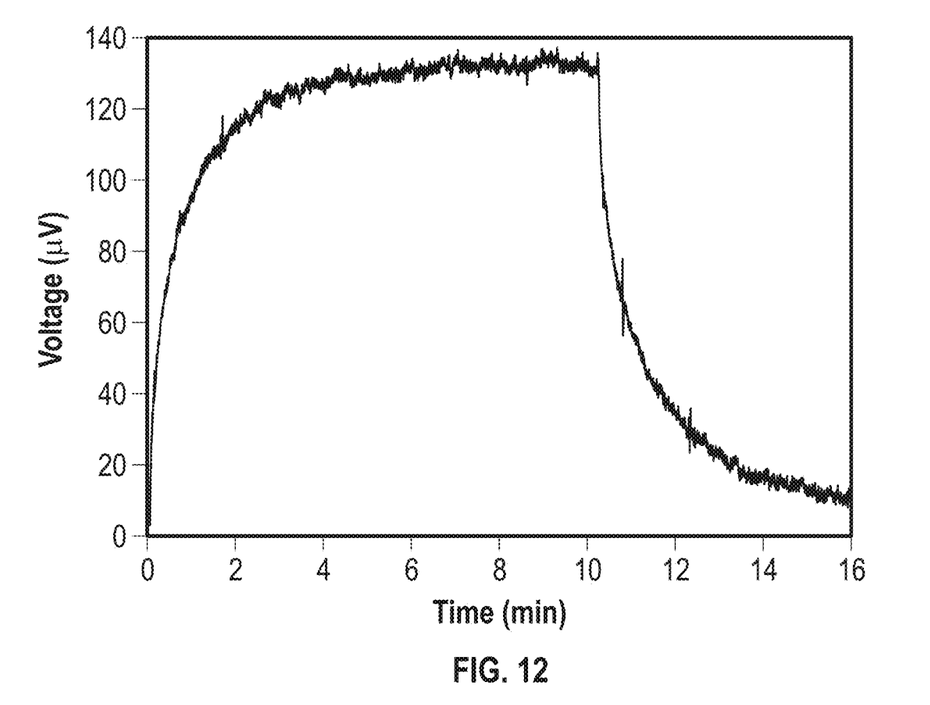
FIG. 12 shows the response time for a Pt:ITO thermocouple exposed to 1 W 850 nm infrared laser. The measured response time was 35.316 s.

Thin film sensors are known for having very fast response times and sensitivities, but when deposited on relatively larger thermal masses their response time properties change. A single Pt:ITO thermocouple was deposited on a mullite coated SiC—SiC CMC and was excited using a focused 1 W 850 nm infrared laser with a 0.7854 mm$^2$ spot size. The laser spot size was fully contained within the thermocouple hot junction region. As shown in FIG. 12, after the laser was turned on the sensor response took ~610 s to equilibrate. This resulted in a measured response time of 35.316 s, which is much larger than is typical for thin film thermocouples due to its being deposited on a mullite coated SiC—SiC CMC. Although only one power value was tested, it is believed that the response time would not drastically change with an increased or decreased excitation source intensity, as has been reported in the literature.

Note that in the specification and claims, "about" or "approximately" means within twenty percent (20%) of the numerical amount cited. As used herein, the singular forms "a," "an," and "the" include plural referents unless the context clearly dictates otherwise. Thus, for example, reference to "a functional group" refers to one or more functional groups, and reference to "the method" includes reference to equivalent steps and methods that would be understood and appreciated by those skilled in the art, and so forth.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

The invention claimed is:

1. A sensor for measuring a temperature gradient across a thickness of a component, the sensor comprising:
   a first hot junction on a first side of the component;
   a first cold junction and a second cold junction on a second side of the component, the second side of the component located across the thickness of the component from the first side; and
   a first electrically conductive trace wrapped around an edge of the component, thereby electrically connecting the first hot junction and the first cold junction.

2. The sensor of claim 1, wherein the component is electrically conductive.

3. The sensor of claim 2, wherein the component comprises a SiC—SiC ceramic matrix composite material.

4. The sensor of claim 2, comprising an insulating or dielectric material at least partially disposed between the first electrically conductive trace and the component.

5. The sensor of claim 4, wherein the insulating or dielectric material comprises mullite.

6. The sensor of claim 2, wherein the first hot junction is formed by the first electrically conductive trace directly contacting the component.

7. The sensor of claim 6, wherein the first electrically conductive trace forms a first thermoelement of a thermocouple and the component forms a second thermoelement of the thermocouple.

8. The sensor of claim 6, wherein the second cold junction comprises a location where the component directly contacts an electrically conductive contact.

9. The sensor of claim 8, wherein the first electrically conductive trace comprises the same material as the electrically conductive contact.

10. The sensor of claim 9, wherein the material comprises platinum.

11. The sensor of claim 1, wherein the first hot junction is formed where the first electrically conductive trace contacts a second conductive trace on the first side, the second conductive trace being wrapped around the edge of the component; and
wherein the first conductive trace and the second conductive trace comprise different materials.

12. The sensor of claim 11, wherein the second conductive trace electrically connects the first hot junction and the second cold junction.

13. The sensor of claim 11, comprising a second hot junction on the first side.

14. The sensor of claim 13, comprising a third conductive trace, the third conductive trace and the first conductive trace comprising the same material;
wherein the third conductive trace provides a connection between the second hot junction and the second conductive trace at an intermediate cold junction on the second side.

15. The sensor of claim 14, comprising a fourth conductive trace, the fourth conductive trace and the second conductive trace comprising the same material;
wherein the fourth conductive trace provides a connection between the second hot junction and the second cold junction.

16. The sensor of claim 11, comprising an electrical load connected to the two cold junctions, thereby configuring the sensor to generate power.

* * * * *